(12) United States Patent
Hirose

(10) Patent No.: US 12,206,034 B2
(45) Date of Patent: Jan. 21, 2025

(54) SOLAR CELL MODULE

(71) Applicant: ZEON CORPORATION, Tokyo (JP)

(72) Inventor: Yuki Hirose, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 68 days.

(21) Appl. No.: 17/594,021

(22) PCT Filed: Mar. 25, 2020

(86) PCT No.: PCT/JP2020/013324
§ 371 (c)(1),
(2) Date: Sep. 30, 2021

(87) PCT Pub. No.: WO2020/209068
PCT Pub. Date: Oct. 15, 2020

(65) Prior Publication Data
US 2022/0328709 A1   Oct. 13, 2022

(30) Foreign Application Priority Data

Apr. 10, 2019 (JP) .................................. 2019-075060

(51) Int. Cl.
*H01L 31/0463* (2014.01)
*H01G 9/048* (2006.01)
(Continued)

(52) U.S. Cl.
CPC ......... *H01L 31/0463* (2014.12); *H01G 9/048* (2013.01); *H01G 9/08* (2013.01); *H01L 31/046* (2014.12)

(58) Field of Classification Search
CPC . H01L 31/046; H01L 31/463; H01L 31/0463; H01G 9/004; H01G 9/048; H01G 9/08
See application file for complete search history.

(56) References Cited

U.S. PATENT DOCUMENTS

2008/0318049 A1   12/2008   Hata et al.
2012/0012158 A1*  1/2012   Park ..................... H01G 9/2068
                                                                438/73
(Continued)

FOREIGN PATENT DOCUMENTS

| EP | 2214208 A2 | 8/2010 |
|----|------------|--------|
| JP | 2018082137 A | 5/2018 |

(Continued)

OTHER PUBLICATIONS

Machine translation of Suzuki et al.*
(Continued)

*Primary Examiner* — Tae-Sik Kang
(74) *Attorney, Agent, or Firm* — KENJA IP LAW PC

(57) ABSTRACT

A solar cell module comprises: two base plates each including a conductive layer on at least one side; and a plurality of submodules interposed between respective conductive layers of the two base plates. The plurality of submodules each include a plurality of cells connected to each other as a result of a conductive material electrically connecting the respective conductive layers of the two base plates. The two base plates each have a plurality of insulating grooves in a gap between the plurality of submodules. The plurality of insulating grooves of one of the two base plates and the plurality
(Continued)

of insulating grooves of an other one of the two base plates define at least one insulating space that prevents short circuiting between adjacent submodules.

3 Claims, 5 Drawing Sheets

(51) Int. Cl.
*H01G 9/08* (2006.01)
*H01L 31/046* (2014.01)

(56) References Cited

U.S. PATENT DOCUMENTS

| | | |
|---|---|---|
| 2014/0076376 A1 | 3/2014 | Lee et al. |
| 2021/0082634 A1* | 3/2021 | Lee .................... H01G 9/2081 |

FOREIGN PATENT DOCUMENTS

| | | | | |
|---|---|---|---|---|
| WO | 2006011655 A1 | 2/2006 | | |
| WO | WO-2016140196 A1 * | 9/2016 | .............. | C09J 11/00 |
| WO | WO2018174247 * | 9/2018 | .............. | H01G 9/20 |
| WO | WO-2018174247 A1 * | 9/2018 | ........... | H01G 9/2004 |

OTHER PUBLICATIONS

Suzuki et al., WO2018174247 (A1), English Machine Translation. (Year: 2018).*

Suzuki et al., JPWO2016140196 (A1), English Machine Translation. (Year: 2018).*

Dec. 2, 2022, the Extended European Search Report issued by the European Patent Office in the corresponding European Patent Application No. 20788095.6.

Sep. 28, 2021, International Preliminary Report on Patentability issued in the International Patent Application No. PCT/JP2020/013324.

Jun. 9, 2020, International Search Report issued in the International Patent Application No. PCT/JP2020/013324.

Sep. 5, 2023, the Extended European Search Report issued by the European Patent Office in the corresponding European Patent Application No. 23179348.0.

* cited by examiner

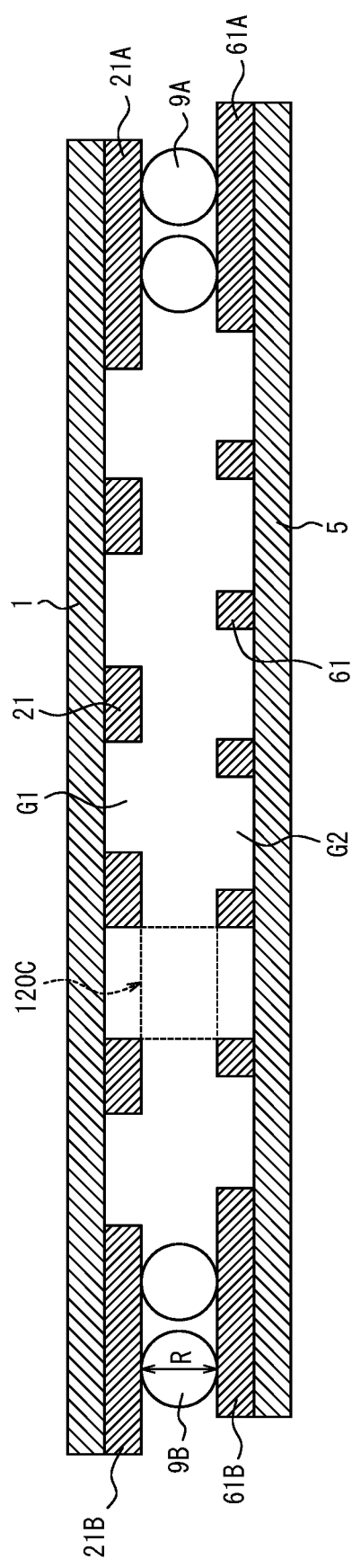

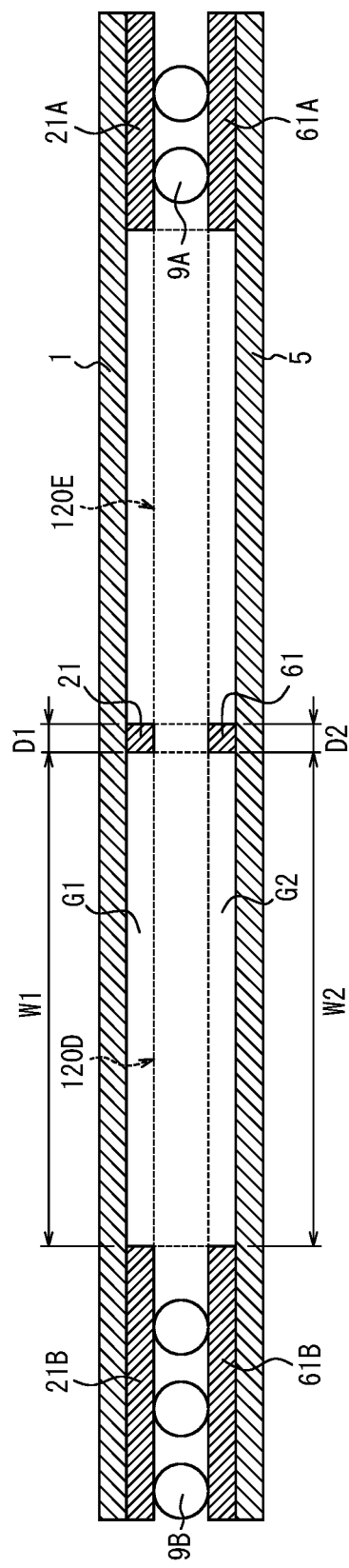

SOLAR CELL MODULE

TECHNICAL FIELD

The present disclosure relates to a solar cell module.

BACKGROUND

In recent years, solar cells have been receiving attention as photoelectric conversion elements that convert light energy into electricity. Examples of solar cells include dye-sensitized solar cells, organic thin-film solar cells, and perovskite solar cells. These solar cells each typically include cells having a structure in which a functional layer that contributes to electron or hole transfer is sandwiched between two electrodes each supported by a substrate made of a resin film or the like. More specifically, a dye-sensitized solar cell includes an electrolyte layer as a functional layer, and each of an organic thin-film solar cell and a perovskite solar cell includes a donor layer and an acceptor layer as functional layers.

Examples of units of solar cells include a cell which is the smallest unit capable of exerting an electromotive force, a submodule formed by electrically connecting a plurality of cells, and a module formed by electrically connecting a plurality of submodules.

Thus, solar cells need a large number of electrical connections. Various methods have conventionally been studied to efficiently produce such solar cells. For example, JP 2018-82137 A (PTL 1) proposes a solar cell module that is series wired only on a base plate and a production method therefor. With the solar cell module and the production method therefor disclosed in PTL 1, upper and lower film substrates are fused by ultrasonic vibration between series-connected adjacent submodules to form a fusion part that functions as an insulation line for preventing short circuiting between the submodules.

CITATION LIST

Patent Literature

PTL 1: JP 2018-82137 A

SUMMARY

Technical Problem

The insulation line disclosed in PTL 1 has room for improvement. It could therefore be helpful to provide a solar cell module including a new inter-submodule insulation structure.

Solution to Problem

To advantageously solve the problem stated above, a solar cell module according to the present disclosure is a solar cell module comprising: two base plates each including a conductive layer on at least one side; and a plurality of submodules interposed between respective conductive layers of the two base plates, wherein the plurality of submodules each include a plurality of cells connected to each other as a result of a conductive material electrically connecting the respective conductive layers of the two base plates, the two base plates each have a plurality of insulating grooves in a gap between the plurality of submodules, and the plurality of insulating grooves of one of the two base plates and the plurality of insulating grooves of an other one of the two base plates define at least one insulating space that prevents short circuiting between adjacent submodules. This structure in which two base plates each have, in a gap between a plurality of submodules, a plurality of insulating grooves that can define at least one insulating space for preventing short circuiting between adjacent submodules is a new insulation structure.

Preferably, the solar cell module according to the present disclosure satisfies the following relationships (1) to (5):

$$W1 > R \text{ and } W2 > R \qquad (1)$$

$$(W1+D1) > (W2+D2) \qquad (2)$$

$$(W1-D2) \leq 2R \qquad (3)$$

$$(W1+D1)/(W2+D2) \neq Z \text{ or } (Z+0.5) \qquad (4)$$

$$N1 \geq (A+1) \text{ and } N2 \geq (B+1) \qquad (5)$$

where the plurality of insulating grooves of the one of the two base plates are denoted as insulating grooves G1, the plurality of insulating grooves of the other one of the two base plates are denoted as insulating grooves G2, W1 is a width of each of the insulating grooves G1 in μm, D1 is a distance between the insulating grooves G1 in μm, N1 is the number of the insulating grooves G1, W2 is a width of each of the insulating grooves G2 in μm, D2 is a distance between the insulating grooves G2 in μm, N2 is the number of the insulating grooves G2, R is a maximum dimension of the conductive material in μm, Z is an integer, and A and B are each independently a minimum natural number satisfying the following relationship (a):

$$A \times (W1+D1) = B \times (W2+D2) \qquad (a).$$

The solar cell module satisfying these conditions has excellent production efficiency. Here, the maximum dimension of the conductive material can be measured by the method described in the EXAMPLES section.

Preferably, the solar cell module according to the present disclosure satisfies the following relationships (1), (6), and (7):

$$W1 > R \text{ and } W2 > R \qquad (1)$$

$$(W1 + (W2+D2) \qquad (6)$$

$$(W1-D2) > 2R \qquad (7)$$

where the plurality of insulating grooves of the one of the two base plates are denoted as insulating grooves G1, the plurality of insulating grooves of the other one of the two base plates are denoted as insulating grooves G2, W1 is a width of each of the insulating grooves G1 in μm, D1 is a distance between the insulating grooves G1 in μm, W2 is a width of each of the insulating grooves G2 in μm, D2 is a distance between the insulating grooves G2 in μm, and R is a maximum dimension of the conductive material in μm.

The solar cell module satisfying these conditions has excellent production efficiency.

Advantageous Effect

It is thus possible to provide a solar cell module including a new inter-submodule insulation structure.

BRIEF DESCRIPTION OF THE DRAWINGS

In the accompanying drawings:

FIG. 4 is a sectional view illustrating a modification of the structure illustrated in FIG. 3; and FIG. 5 is a sectional view illustrating a structure of insulating spaces according to another one of the disclosed embodiments.

DETAILED DESCRIPTION

Some of the disclosed embodiments will be described in detail below, with reference to the drawings. A solar cell module according to the present disclosure may, without any limitations, be a solar cell module of a dye-sensitized solar cell, an organic thin-film solar cell, a perovskite solar cell module, or the like. The solar cell module according to the present disclosure may be a module formed by series connecting a plurality of submodules that are each formed by series connecting a plurality of photoelectric conversion cells (hereafter also simply referred to as "cells"), for example, a plurality of submodules having a Z-type integrated structure. Examples of integrated structures of submodules besides that of a Z-type module include a series connection structure such as that of a W-type module or a monolithic module, and a parallel connection structure, without being limited thereto.

(Solar Cell Module)

Figure 1:
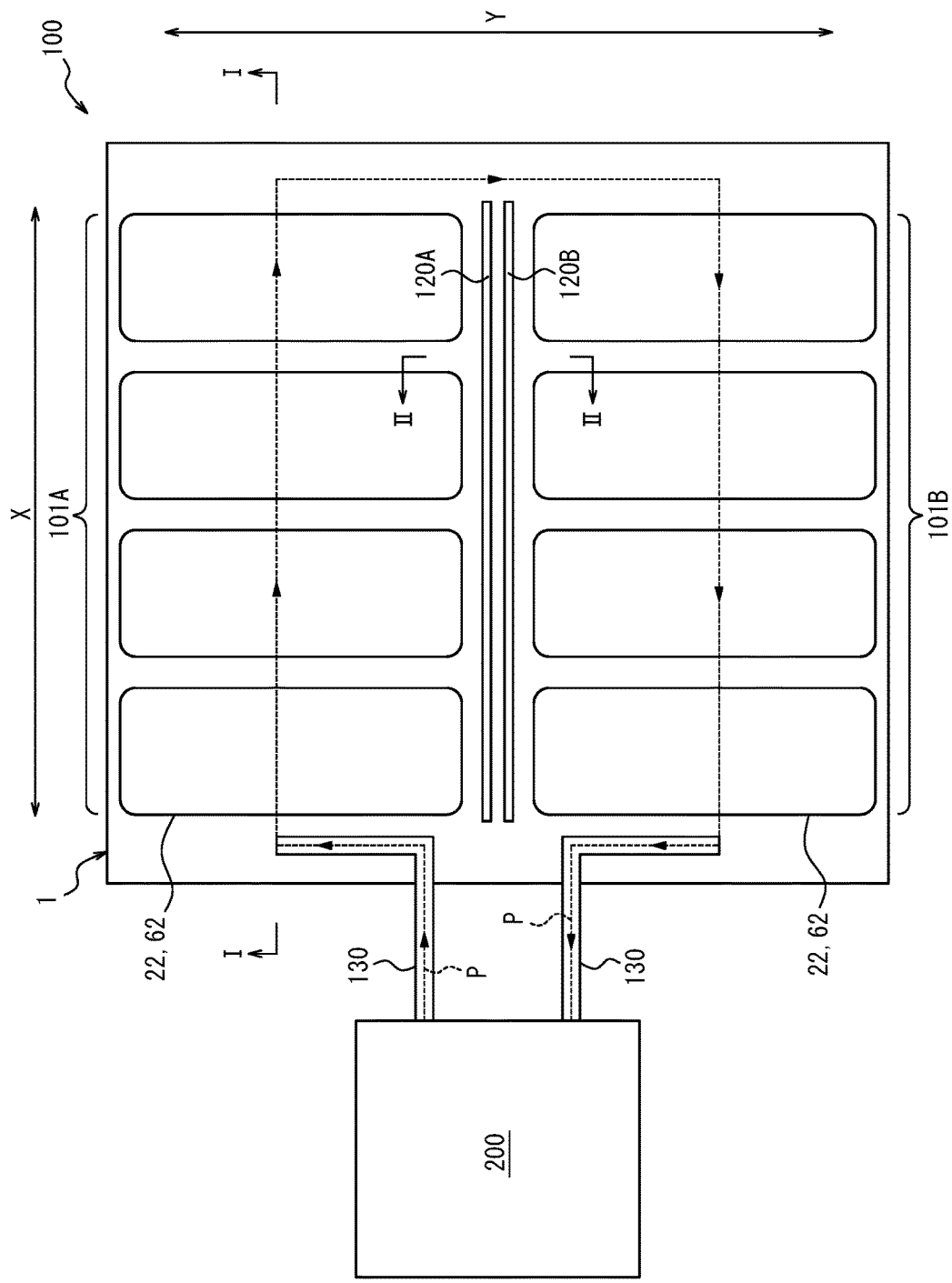
FIG. 1 is a plan view illustrating an example of a schematic structure of a solar cell module according to one of the disclosed embodiments.
Figure 2:
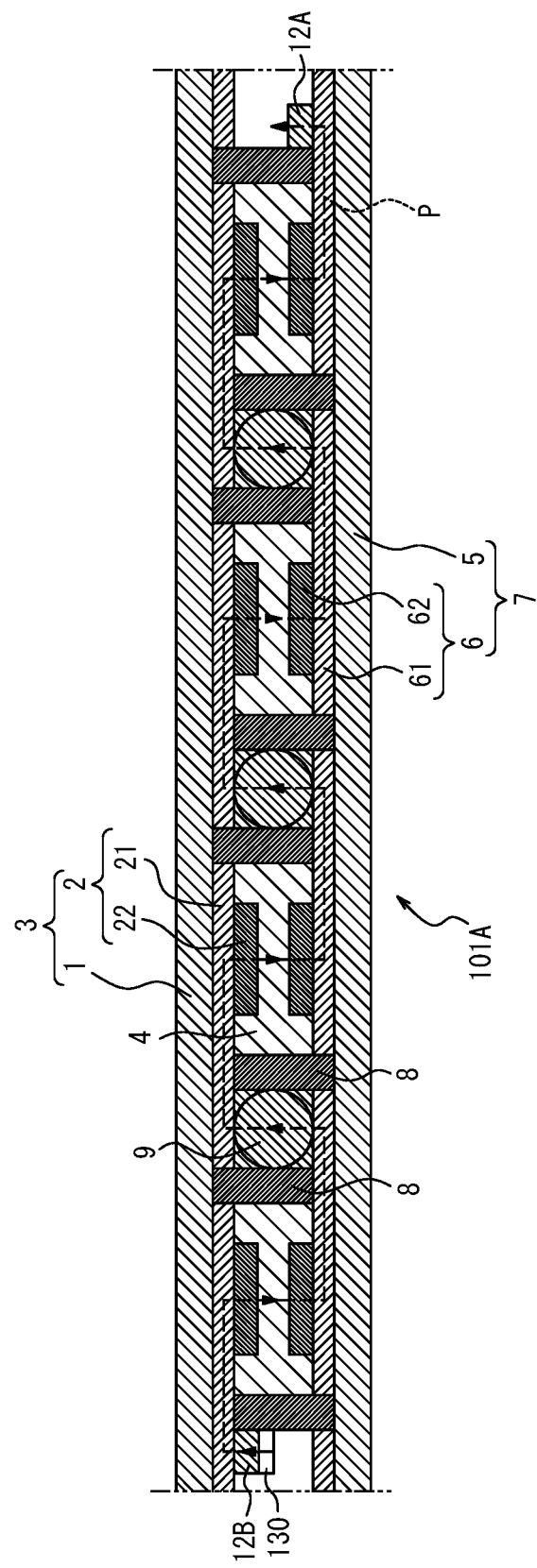
FIG. 2 is a I-I sectional view illustrating a schematic structure of a submodule included in the solar cell module illustrated in FIG. 1.

Examples of a dye-sensitized solar cell module having a Z-type integrated structure as one example of the present disclosure include, but are not limited to, a solar cell module 100 illustrated in the plan view in FIG. 1. FIG. 2 is a sectional view (I-I sectional view) illustrating a submodule 101A included in the solar cell module 100 illustrated in FIG. 1, in the thickness direction.

The solar cell module 100 illustrated in the plan view in FIG. 1 is a solar cell module including: two base plates each including a conductive layer on at least one side; and a plurality of submodules 101A and 101B interposed between the respective conductive layers of the two base plates. The plurality of submodules 101A and 101B each include a plurality of cells that are connected to each other as a result of a conductive material electrically connecting the respective conductive layers of the two base plates. The two base plates each have a plurality of insulating grooves in a gap between the plurality of submodules. The plurality of insulating grooves of one of the two base plates and the plurality of insulating grooves of the other one of the two base plates define one or more insulating spaces 120A and 120B that prevent short circuiting between adjacent submodules.

More specifically, the solar cell module 100 includes two submodules 101A and 101B and two insulating spaces 120A and 120B that prevent short circuiting between the two submodules 101A and 101B, and preferably further includes lead-out wiring 130. A first substrate 1 on the near side in FIG. 1, which corresponds to the upper surface of the solar cell module 100, has a conductive layer (a photoelectrode conductive layer 21 not illustrated in FIG. 1) on its inner surface. The first substrate 1 and the conductive layer are transparent, so that a porous semiconductor fine particulate layer 22 and a catalyst layer 62 located inward from the first substrate 1 are visually recognizable. Other components that can be included in the submodules 101A and 101B are omitted in FIG. 1. In FIG. 1, a conduction path P from an external device 200 through the solar cell module 100 back to the external device 200 is designated by a dashed line. In the solar cell module 100, the plurality of cells arranged in a first direction X are connected in series with each other in each of the submodules 101A and 101B, and the two submodules 101A and 101B arranged in a second direction Y are connected in series with each other, as illustrated in FIG. 1. In the illustrated example, the first direction X and the second direction Y are orthogonal to each other.

<Lead-Out Wiring>

The lead-out wiring 130 included in the solar cell module 100 electrically connects the external device 200 and each of the submodule 101A illustrated on the upper side in FIG. 1 and the submodule 101B illustrated on the lower side in FIG. 1.

<Insulating Space>

The insulating spaces 120A and 120B (hereafter also collectively referred to as "insulating space 120") are spaces provided inside the solar cell module in order to prevent short circuiting between the adjacent submodules 101A and 101B. For example, the insulating space 120 can prevent short circuiting between the submodules 101A and 101B even in the case where a conductive material forming electrical connection between cells in each of the submodules 101A and 101B lies off the predetermined region of the submodule due to a production error or the like. Specifically, the insulating space 120 is a space that is sized to allow at least one conductive material to be contained in a noncontact state and in which electrical connection is unlikely to be formed by at least one conductive material. Although the solar cell module 100 includes two insulating spaces 120A and 120B in FIG. 1, the number of insulating spaces that can be included in the solar cell module according to the present disclosure is not limited to two. Moreover, various arrangements of insulating spaces 120 are possible. The insulating space 120 will be described in detail later. Herein, the detailed structure of the solar cell module 100 according to one of the disclosed embodiments will be described first with reference to FIG. 2 and then the insulating space 120 will be described in detail with reference to FIGS. 3 to 5, to facilitate understanding.

<Submodule>

As illustrated in FIG. 2, the submodule 101A is a dye-sensitized solar cell submodule including a plurality of (four in the illustrated example) cells that are defined by partitions 8 and are connected in series, and has a Z-type integrated structure. The submodule 101A has a structure in which a first base plate 3 including a first substrate 1 and a plurality of (four in the illustrated example) photoelectrodes (first electrodes) 2 arranged on the first substrate 1 with spacing from each other and a second base plate 7 including a second substrate 5 and a plurality of (four in the illustrated example) counter electrodes (second electrodes) 6 arranged on the second substrate 5 with spacing from each other are bonded together in a state in which partitions 8 are interposed between the first base plate 3 and the second base plate 7 so that the photoelectrode 2 and the counter electrode 6 in each cell face each other with an electrolyte layer 4 as a functional layer therebetween (so as to form a cell) and the photoelectrode 2 in one of adjacent cells and the counter electrode 6 in the other one of the adjacent cells are electrically connected via a conductive material 9. Each cell in the submodule 101A includes the photoelectrode 2, the counter electrode 6 facing the photoelectrode 2, and the electrolyte layer 4 located between the photoelectrode 2 and the counter electrode 6. The submodule 101B has the same structure as the submodule 101A, though not illustrated.

The submodule 101A includes a counter electrode conductive layer 61 included in the counter electrode 6 and a first electrical connector 12A. The first electrical connector 12A is in contact with a conductive material (not illustrated). This conductive material can form electrical connection with the submodule 101B. The submodule 101A also includes a second electrical connector 12B that connects a photoelectrode conductive layer 21 included in the photoelectrode 2 and the lead-out wiring 130. Although the first electrical connector 12A and the second electrical connector 12B are provided on the different base plates in the illustrated example, the presently disclosed techniques are not limited to such, and the first electrical connector 12A and the second electrical connector 12B may be provided on the same base plate by additionally providing a structure for routing. The structure for routing can be optionally formed using, for example, the partition 8 and the conductive material 9.

<First Base Plate>

The first base plate 3 in the submodule 101A illustrated in FIGS. 1 and 2 includes the first substrate 1 and the plurality of photoelectrodes 2 arranged on the first substrate 1 with spacing from each other. The photoelectrodes 2 each include the photoelectrode conductive layer 21 located on the first substrate 1 and the porous semiconductor fine particulate layer 22 located on part of the photoelectrode conductive layer 21. Photoelectrode conductive layers 21 are disposed with gaps therebetween. Adjacent photoelectrodes 2 are electrically insulated from each other. This insulation may be achieved, for example, by the partitions 8 present in the gap between the adjacent photoelectrode conductive layers 21, without being limited thereto.

The first substrate 1 is not limited, and may be selected as appropriate from commonly known light transmissive substrates. Examples of the first substrate 1 include known transparent substrates having transparency in the visible region, such as a transparent resin and glass. In particular, a resin formed into a film, i.e. a resin film, is preferably used as the first substrate 1. Using a resin film as the first substrate 1 can make the submodule 101A lightweight and flexible. The solar cell module 100 including such submodule 101A can be used in various applications.

Examples of transparent resins that may be used to form a resin film include synthetic resins such as polyethylene terephthalate (PET), polyethylene naphthalate (PEN), syndiotactic polystyrene (SPS), polyphenylene sulfide (PPS), polycarbonate (PC), polyarylate (PAr), polysulfone (PSF), polyethersulfone (PES), polyetherimide (PEI), transparent polyimide (PI), and cycloolefin polymer (COP).

The photoelectrode conductive layer 21 is not limited, and may be obtained by forming a conductive layer composed of a metal mesh containing Au, Ag, Cu, or the like, a conductive layer formed through application of metal nanoparticles such as Ag nanoparticles, fine Ag wires, or the like, a conductive layer containing a composite metal oxide such as indium tin oxide (ITO), indium zinc oxide (IZO), or fluorine-doped tin oxide (FTO), a carbon-based conductive layer containing carbon nanotubes, graphene, or the like, or a conductive layer containing a conductive polymer such as PEDOT/PSS (poly(3,4-ethylenedioxythiophene) polystyrene sulfonate). These materials may be selected as appropriate depending on, for example, compatibility with other materials. A plurality of types of such conductive layers may be stacked on a substrate. Alternatively, various conductive materials that can be used to form these conductive layers as mentioned above may be mixed to form a single conductive layer.

The photoelectrode conductive layer 21 may be formed on the first substrate 1 by a known formation method such as a method that combines sputtering and etching, or screen printing.

An undercoat layer (not illustrated) may optionally be disposed on the photoelectrode conductive layer 21. In the case where the below-described electrolyte layer 4 is liquid, an electrolyte solution may reach the photoelectrode conductive layer 21 through the porous semiconductor fine particulate layer 22, causing an internal short-circuit phenomenon called reverse electron transfer in which electrons leak from the photoelectrode conductive layer 21 into the electrolyte layer 4. This may induce reverse current that is unrelated to light irradiation, and decrease photoelectric conversion efficiency. Such internal short-circuit phenomenon can be prevented by providing the undercoat layer on the photoelectrode conductive layer 21. Providing the undercoat layer on the photoelectrode conductive layer 21 can also improve close adherence between the porous semiconductor fine particulate layer 22 and the photoelectrode conductive layer 21.

The undercoat layer is not limited as long as it is a substance that can prevent the internal short-circuit phenomenon (in other words, a substance that resists an interface reaction). For example, the undercoat layer may be a layer containing a material such as titanium oxide, niobium oxide, or tungsten oxide. The undercoat layer may be formed by a method whereby the foregoing material is directly sputtered onto a transparent conductive layer, or a method whereby a solution obtained by dissolving the foregoing material in a solvent, a solution obtained by dissolving a metal hydroxide which is a precursor of a metal oxide, or a solution containing a metal hydroxide obtained by dissolving an organometallic compound in a mixed solvent containing water is applied onto the photoelectrode conductive layer 21 and dried, and optionally sintered.

The porous semiconductor fine particulate layer 22 on which a sensitizing dye is supported (adsorbed) is not limited, and may be a porous semiconductor fine particulate layer obtained through adsorption of a sensitizing dye such as an organic dye or a metal complex dye by a porous semiconductor fine particulate layer containing particles of an oxide semiconductor such as titanium oxide, zinc oxide, or tin oxide. Examples of the organic dye include cyanine dyes, merocyanine dyes, oxonol dyes, xanthene dyes, squarylium dyes, polymethine dyes, coumarin dyes, riboflavin dyes, and perylene dyes. Examples of the metal complex dye include bipyridine complexes, phthalocyanine complexes, and porphyrin complexes of metals such as iron, copper, and ruthenium. Typical examples of the sensitizing dye include N3, N719, N749, D102, D131, D150, N205, HRS-1, and HRS-2. It is preferable that an organic solvent in which the sensitizing dye is dissolved is subjected to degassing and purification by distillation in advance in order to remove moisture and gas present in the solvent. Preferable examples of the organic solvent include alcohols such as methanol, ethanol, and propanol, nitriles such as acetonitrile, halogenated hydrocarbons, ethers, amides, esters, carbonate esters, ketones, hydrocarbons, aromatics, and nitromethane. A mixture of two or more types of these solvents may be used.

The porous semiconductor fine particulate layer 22 may be formed on the photoelectrode conductive layer 21 by a known formation method such as screen printing or coating. The sensitizing dye may be adsorbed by the porous semiconductor fine particulate layer by a known method such as immersion of the porous semiconductor fine particulate layer in a solution containing the sensitizing dye.

<Second Base Plate>

The second base plate 7 in the submodule 101A includes the second substrate 5 and the plurality of counter electrodes 6 arranged on the second substrate 5 with spacing from each other. The counter electrodes 6 each include the counter electrode conductive layer 61 located on the second substrate 5 and the catalyst layer 62 located on part of the counter electrode conductive layer 61. Counter electrode conductive layers 61 are disposed with gaps therebetween. The catalyst layer 62 faces the porous semiconductor fine particulate layer 22 in the photoelectrode 2.

Adjacent counter electrodes 6 are electrically insulated from each other. This insulation may be achieved, for example, by the partitions 8 present in the gap between the adjacent counter electrodes 6, without being limited thereto.

The second substrate 5 may be the same type of substrate as the first substrate 1, or a non-transparent substrate such as foil or plate of titanium, SUS, aluminum, or the like and resistant to corrosion by other solar cell members. In particular, the second substrate 5 is preferably formed using a resin film, for the same reasons as for the first substrate 1.

The same type of conductive layer as the photoelectrode conductive layer 21 may be used as the counter electrode conductive layer 61.

The catalyst layer 62 is not limited, and may be any catalyst layer containing a component that can function as a catalyst such as a conductive polymer, a carbon nanostructure, a precious metal, or a mixture of a carbon nanostructure and a precious metal.

Examples of the conductive polymer include polythiophenes such as poly(thiophene-2,5-diyl), poly(3-butylthiophene-2,5-diyl), poly(3-hexylthiophene-2,5-diyl), and poly(2,3-dihydrothieno-[3,4-b]-1,4-dioxine) (PEDOT); polyacetylene and derivatives thereof; polyaniline and derivatives thereof; polypyrrole and derivatives thereof; and polyphenylene vinylenes such as poly(p-xylene tetrahydrothiophenium chloride), poly[(2-methoxy-5-(2'-ethylhexyloxy))-1,4-phenylenevinylene], poly[(2-methoxy-5-(3',7'-dimethyloctyloxy)-1,4-phenylenevinylene)], and poly[2-(2',5'-bis(2''-ethylhexyloxy)phenyl)-1,4-phenylenevinylene].

Examples of the carbon nanostructure include natural graphite, activated carbon, artificial graphite, graphene, carbon nanotubes, and carbon nanobuds.

The precious metal is not limited as long as it has a catalytic effect. Commonly known precious metals such as platinum metal, palladium metal, and ruthenium metal may be selected for use as appropriate.

The catalyst layer may be formed by a commonly known method that is selected as appropriate without any limitations. For example, the catalyst layer may be formed by applying or spraying, onto a conductive film, a mixed solution obtained by dissolving or dispersing a conductive polymer, a carbon nanostructure, a precious metal, or both a carbon nanostructure and a precious metal in an appropriate solvent, and drying the solvent of the mixed solution. In the case of using a carbon nanostructure or a precious metal, the mixed solution may further contain a binder. The binder is preferably a polymer that contains a functional group such as a hydroxy group, a carboxyl group, a sulfonyl group, or a phosphate group, a sodium salt of these functional groups, or the like, from the viewpoint of carbon nanostructure dispersibility and close adherence to a substrate. The catalyst layer may be formed by an existing formation method such as screen printing, evaporation, or sputtering.

The catalyst layer may contain carbon nanotubes (hereinafter also referred to as "prescribed carbon nanotubes") whose average diameter (Av) and diameter standard deviation ($\sigma$) satisfy $0.60 > 3\sigma/Av > 0.20$ (hereinafter also referred to as "formula (A)"). The term "prescribed carbon nanotubes" as used herein is a general term for collectively referring to specific carbon nanotubes composing the prescribed carbon nanotubes, and the term "diameter" as used herein denotes the outer diameter of the specific carbon nanotubes.

The average diameter (Av) and the diameter standard deviation ($\sigma$) of the prescribed carbon nanotubes are respectively a sample average value and a sample standard deviation. These values are determined as an average value and a standard deviation when the diameters of 100 randomly selected carbon nanotubes are measured by observation under a transmission electron microscope. $3\sigma$ in formula (A) is the obtained standard deviation ($\sigma$) multiplied by 3.

A counter electrode having excellent catalytic activity can be obtained by using the prescribed carbon nanotubes. From the viewpoint of improving the characteristics of the obtained counter electrode, the carbon nanotubes preferably satisfy $0.60 > 3\sigma/Av > 0.25$, and more preferably satisfy $0.60 > 3\sigma/Av > 0.50$.

$3\sigma/Av$ expresses the diameter distribution of the prescribed carbon nanotubes, and a larger value of $3\sigma/Av$ indicates a wider diameter distribution. The diameter distribution preferably takes a normal distribution. In this case, the diameter distribution can be obtained by measuring the diameters of 100 randomly selected carbon nanotubes that can be observed using a transmission electron microscope, using the results to plot the obtained data with the diameter on the horizontal axis and the frequency on the vertical axis, and making a Gaussian approximation. Although a large $3\sigma/Av$ value can be obtained by combining a plurality of types of carbon nanotubes obtained by different production methods, it is difficult to obtain a normal distribution for the diameter distribution in such a case. The prescribed carbon nanotubes may be a single type of carbon nanotubes or carbon nanotubes obtained by blending a single type of carbon nanotubes with an amount of other carbon nanotubes that does not affect the diameter distribution of the single type of carbon nanotubes.

The prescribed carbon nanotubes may be obtained by a commonly known method such as a method (super growth method) whereby, when supplying a feedstock compound and a carrier gas onto a substrate (hereinafter also referred to as "substrate for CNT production") having a catalyst layer for carbon nanotube production (hereinafter also referred to as "catalyst layer for CNT production") on its surface and synthesizing carbon nanotubes through chemical vapor deposition (CVD), a trace amount of an oxidizing agent is provided in the system to significantly improve the catalytic activity of the catalyst layer for CNT production (for example, WO 2006/011655 A1). Carbon nanotubes produced by the super growth method are hereafter also referred to as SGCNTs.

A counter electrode including a catalyst layer having the prescribed carbon nanotubes as a constituent material can be produced by, for example, preparing a dispersion liquid containing the prescribed carbon nanotubes, applying the dispersion liquid onto a substrate, and drying the resultant coating film to form a catalyst layer.

<Partition>

The partitions 8 in the submodule 101A are disposed between the first base plate 3 and the second base plate 7, and surround each of the electrolyte layer 4 and the conductive material 9. In other words, the space in which the electrolyte layer 4 is provided and the space in which the conductive material 9 is provided are each defined by the first base plate 3, the second base plate 7, and the partitions 8.

Specifically, in FIG. 2, a partition 8 is provided between the first substrate 1 in the first base plate 3 and the counter electrode conductive layer 61 of the counter electrode 6 in the second base plate 7 on one side (right side in FIG. 2) of each cell in the width direction, and a partition 8 is provided between the photoelectrode conductive layer 21 of the photoelectrode 2 in the first base plate 3 and the second substrate 5 in the second base plate 7 on the other side (left side in FIG. 2) of the cell in the width direction. The electrolyte layer 4 and the conductive material 9 are alternately arranged between the partitions 8.

The partitions 8 are not limited as long as they are capable of adhering the first base plate 3 and the second base plate 7 and sealing the electrolyte layer 4. The partitions 8 preferably have excellent adhesiveness between base plates, electrolyte resistance (chemical resistance), and durability under high temperature and high humidity (wet heat resistance). Examples of partition materials that can form such partitions 8 include non-conductive thermoplastic resins, thermosetting resins, and active radiation (light, electron beam) curable resins. More specific examples include (meth)acrylic resins, fluororesins, silicone resins, olefinic resins, urethane resins, and polyamide resins. Herein, "(meth)acryl" denotes "acryl" or "methacryl". In particular, a photocurable acrylic resin is preferable from the viewpoint of handleability.

The partitions 8 may be formed using films obtained by shaping any of the foregoing various resins in sheet form, from the viewpoint of ease of production.

<Functional Layer>

The electrolyte layer 4 which is a functional layer in the submodule 101A is provided in the space surrounded by the porous semiconductor fine particulate layer 22 of the photoelectrode 2, the catalyst layer 62 of the counter electrode 6, and the partitions 8. The electrolyte layer 4 may be formed using any electrolyte solution, gel electrolyte, or solid electrolyte that can be used in dye-sensitized solar cells, without being limited thereto.

<Conductive Material>

The conductive material 9 in the submodule 101A electrically connects adjacent cells in series. Specifically, the conductive material 9 electrically connects the photoelectrode conductive layer 21 of the photoelectrode 2 in a cell located on the right side in FIG. 2 and the counter electrode conductive layer 61 of the counter electrode 6 in a cell located on the left side in FIG. 2.

The conductive material 9 in the submodule 101A is located in the space surrounded by the photoelectrode conductive layer 21 of the photoelectrode 2, the counter electrode conductive layer 61 of the counter electrode 6, and the two partitions 8. In the submodule 101A illustrated in FIG. 2, the conductive material 9 electrically connects the photoelectrode conductive layer 21 and the counter electrode conductive layer 61. Alternatively, the conductive material 9 and wiring made of a conductive material such as a metal, e.g. silver, or a metal oxide may form electrical connection between the photoelectrode and the counter electrode. In this case, the wiring may be formed on any of the photoelectrode side and the counter electrode side.

Examples of the conductive material 9 include, but are not limited to, particles of metals such as Ag, Au, Cu, Al, In, Sn, Bi, and Pb and oxides thereof; conductive carbon particles; and particles obtained by coating the surfaces of organic compound particles such as resin particles or inorganic compound particles with a conductive substance such as a metal (for example, Ag, Au, or Cu) or an oxide of such metal (for example, Au/Ni alloy coated particles). Herein, the term "particles" denotes an object having an aspect ratio of 2.0 or less. The aspect ratio of the particles as the conductive material 9 is more preferably 1.5 or less, further preferably 1.2 or less, particularly preferably 1.1 or less, and further particularly preferably 1.0. The aspect ratio of the particles as the conductive material 9 may be calculated as follows: 100 particles are microscopically observed to calculate the number-average major axis length and the number-average minor axis length, and the value of (number-average major axis length/number-average minor axis length) is taken to be the aspect ratio. If the aspect ratio is not greater than the foregoing upper limit, and particularly if the aspect ratio is 1.0, the production efficiency of the solar cell module can be further enhanced.

The typical shape of the conductive material 9 is preferably spherical, such as an oblate spherical shape or a true spherical shape. In particular, a true spherical shape or an oblate spherical shape as close to a true sphere as possible is preferable. Thus, the production efficiency of the solar cell module can be further enhanced.

The maximum dimension of the conductive material 9 corresponds to the number-average major axis length of the conductive material 9 calculated in the foregoing manner. The maximum dimension R of the conductive material 9 is preferably 0.5 µm or more and 30 µm or less. If the maximum dimension R of the conductive material 9 is not less than the foregoing lower limit, the photoelectrode and the counter electrode can be effectively prevented from easily short circuiting in the submodule. If the maximum dimension R of the conductive material 9 is not greater than the foregoing upper limit, the photoelectric conversion efficiency of the solar cell module can be enhanced.

The conductive material 9 is preferably provided in the predetermined space in the submodule 101A using a conductive resin composition containing a resin and conductive particles, without being limited thereto. Examples of the resin that may be contained in the conductive resin composition include, but are not limited to, (meth)acrylic resins; epoxy resins such as bisphenol-type epoxy resins, novolac-type epoxy resins, cyclic epoxy resins, and alicyclic epoxy resins; and silicone resins. Any curing agent such as a radical initiator, a cationic curing agent, or an anionic curing agent may be used for the resin. The polymerization form is not limited, and may be addition polymerization, ring-opening polymerization, or the like. The resin as the partition material and the resin that may be included in the conductive resin composition used to form conductive material 9 may be the same or different. The content percentage of the conductive particles in the conductive resin composition that may be used when applying the conductive material 9 is preferably 0.1 vol % or more and 90 vol % or less.

To provide the conductive material 9 at the predetermined position in the submodule 101A using the foregoing composition, for example, a method including charging an uncured composition containing the conductive material 9 and a resin at the position at which the conductive material 9 is to be located (for example, the space enclosed by the partitions 8) and curing the charged uncured composition may be used, without being limited thereto.

<Electrical Connector>

The first electrical connector 12A connects the counter electrode conductive layer 61 in the submodule 101A and the photoelectrode conductive layer 21 in the submodule 101B (not illustrated in FIG. 2) in series, via a structure for routing (not illustrated). The structure for routing may be, for example, optionally formed by the partitions 8 and the conductive material 9. The second electrical connector 12B connects the lead-out wiring 130 and the photoelectrode conductive layer 21. The first electrical connector 12A and the second electrical connector 12B may be made of a typical electrical connection material such as a conductive resin composition or solder, without being limited thereto. As the conductive resin composition, a known composition that contains a material having conductivity such as a metal, a metal oxide, or a conductive carbon material and any resin may be used. As the solder, solder that contains tin, silver, copper, bismuth, lead, a flux component, or the like may be used.

<Arrangement of Insulating Grooves>

Figure 3:
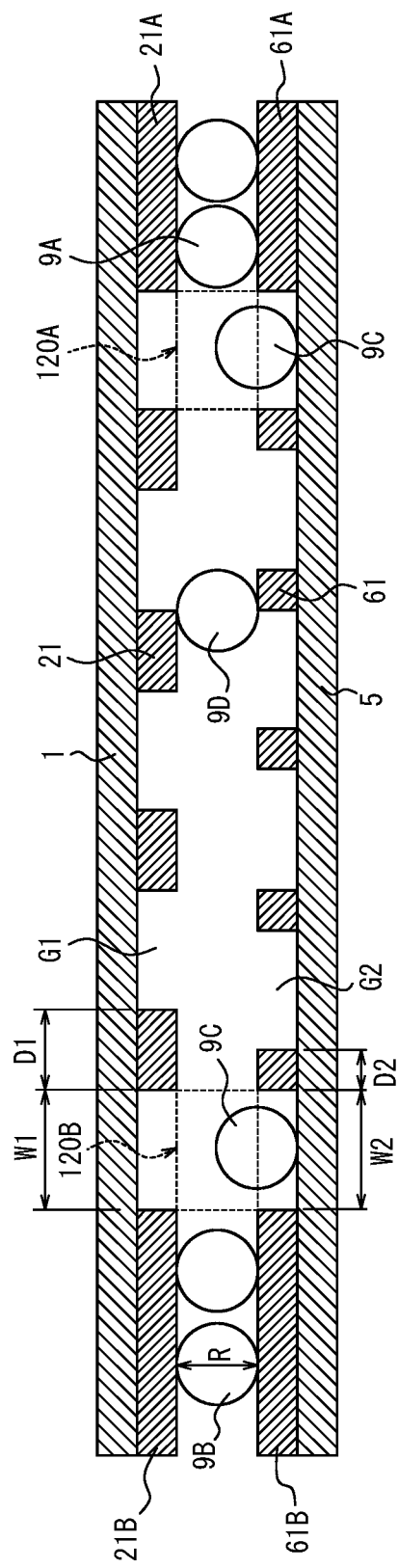
FIG. 3 is a sectional view illustrating a structure of insulating spaces according to one of the disclosed embodiments.

An example of the detailed structure of the insulating spaces 120 illustrated in FIG. 1 as an example will be described below, with reference to FIG. 3. FIG. 3 is a sectional view along line II-II in FIG. 1, and illustrates an example of the structure of the insulating spaces. Each component on the submodule 101A side is designated by adding "A" to the reference sign of the component in FIG. 2, and each component on the submodule 101B side is designated by adding "B" to the reference sign of the component in FIG. 2. In FIG. 3, the photoelectrode conductive layer 21A, the conductive material 9A, and the counter electrode conductive layer 61A ensure series connection between cells in the submodule 101A, and the photoelectrode conductive layer 21B, the conductive material 9B, and the counter electrode conductive layer 61B ensure series connection between cells in the submodule 101B. In the region on the first substrate 1 corresponding to the gap between the submodules 101A and 101B, a plurality of regions lacking the photoelectrode conductive layer 21, i.e. a plurality of first insulating grooves G1, are provided. In the region on the second substrate 5 corresponding to the gap between the submodules 101A and 101B, a plurality of regions lacking the counter electrode conductive layer 61, i.e. a plurality of second insulating grooves G2, are provided. In other words, the photoelectrode conductive layer 21 is discontinuous at the first insulating grooves G1, and the counter electrode conductive layer 61 is discontinuous at the second insulating grooves G2.

The insulating spaces 120A and 120B are each a space that is sized to allow a conductive material 9C to be contained in a noncontact state. The insulating spaces 120A and 120B can thus create a state in which the conductive material 9C is not in contact with at least one of the photoelectrode conductive layer 21 and the counter electrode conductive layer 61. Since the conductive material 9C does not form electrical connection, conduction between the adjacent submodules 101A and 101B does not occur in a part other than the conduction path P connecting the submodules as described above with reference to FIG. 1, and consequently short circuiting between the submodules 101A and 101B can be prevented. The material, properties, etc. of the conductive material 9C contained in each of the insulating spaces 120A and the insulating space 120B are the same as those of the conductive material 9A and the conductive material 9B. There is a possibility that a conductive material 9D located in the region extending between the insulating spaces 120A and 120B is in contact with both the photoelectrode conductive layer 21 and the counter electrode conductive layer 61. Even in this case, insulation between the adjacent submodules 101A and 101B can be ensured by the first insulating grooves G1 and the second insulating grooves G2 and by the insulating spaces 120A and 120B.

The insulating spaces 120A and 120B having the structure illustrated in FIG. 3 as an example are preferably defined by the plurality of first insulating grooves G1 and the plurality of second insulating grooves G2 arranged to satisfy the following conditions. In detail, the plurality of first insulating grooves G1 and the plurality of second insulating grooves G2 are preferably arranged to satisfy all of the following conditions (1) to (5):

$$W1 > R \text{ and } W2 > R \tag{1}$$

$$(W1+D1) > (W2+D2) \tag{2}$$

$$(W1-D2) \leq 2R \tag{3}$$

$$(W1+D1)/(W2+D2) \neq Z \text{ or } (Z+0.5) \tag{4}$$

$$N1 \geq (A+1) \text{ and } N2 \geq (B+1) \tag{5}$$

where W1 (μm) is the width of each first insulating groove G1, D1 (μm) is the distance between the first insulating grooves G1, N1 is the number of the first insulating grooves G1, W2 (μm) is the width of each second insulating groove G2, D2 (μm) is the distance between the second insulating grooves G2, N2 is the number of the second insulating grooves G2, R (μm) is the maximum dimension of each of the conductive materials 9A, 9B, and 9C, Z is an integer, and A and B are each independently a minimum natural number satisfying the following relationship (a):

$$A \times (W1+D1) = B \times (W2+D2) \tag{$\alpha$}$$

In the example illustrated in FIG. 3, the upper substrate in FIG. 3 is the first substrate 1, the lower base plate is the second substrate 5, the first insulating grooves G1 are located on the first substrate 1 side, and the second insulating grooves G2 are located on the second substrate 5 side. The presently disclosed techniques are, however, not limited to the illustrated example, and the first insulating grooves G1 and the second insulating grooves G2 may be located respectively on the second substrate 5 side and on the first substrate 1 side.

FIG. 4 illustrates an example in which the first substrate 1 having the plurality of first insulating grooves G1 and the second substrate 5 having the plurality of second insulating grooves G2 arranged in the same way as in FIG. 3 are arranged so as to be different in relative position from that illustrated in FIG. 3. Such misalignment as illustrated in FIG. 4 can be caused by a production error when producing the solar cell module. Even in the case where the relative positional relationship between the first substrate 1 and the second substrate 5 is different from that in FIG. 3, an insulating space 120C is formed as illustrated in FIG. 4. Hence, insulation between the adjacent submodules 101A and 101B can be ensured even in the from illustrated in FIG. 4. In a solar cell module having the structure illustrated in FIG. 3 or 4, an insulating space can be formed reliably even in the case where a production error occurs during production and the upper and lower base plates are bonded together in a misaligned state. The solar cell module having the structure illustrated in FIG. 3 or 4 therefore has high yield in production and has excellent production efficiency.

FIG. 5 illustrates an insulating space structure according to another example. In FIG. 5, components having the same functions as the components included in the structure illustrated in each of FIGS. 3 and 4 are given the same reference signs as in FIGS. 3 and 4, and their description is omitted. The structure illustrated in FIG. 5 includes insulating spaces 120D and 120E. The structure illustrated in FIG. 5 does not satisfy all of the foregoing relationships (1) to (5). Specifically, in the structure illustrated in FIG. 5, the value of (W1+D1) and the value of (W2+D2) are equal, and W1 is much greater than D2. The structure illustrated in FIG. 5 therefore does not satisfy the foregoing relationships (2) to (4).

The structure illustrated in FIG. 5 satisfies at least the following relationships (1), (6), and (7):

$$W1 > R \text{ and } W2 > R \tag{1}$$

$$(W1+D1) \geq (W2+D2) \tag{6}$$

$$(W1-D2) > 2R \tag{7}$$

The first insulating grooves G1 and the second insulating grooves G2 arranged to satisfy the foregoing relationships (1), (6), and (7) can ensure favorable insulating spaces, too. Even in the case where the first substrate 1 having the plurality of first insulating grooves G1 and the second substrate 5 having the plurality of second insulating grooves G2 arranged as illustrated in FIG. 5 are misaligned, at least one insulating space can be ensured. A solar cell module having such a structure therefore has high yield in production and has excellent production efficiency.

The width W1 of each first insulating groove G1 and the width W2 of each second insulating groove G2 are each preferably not greater than 10 times the maximum dimension R of each of the conductive materials 9A, 9B, and 9C, more preferably not greater than 8 times the maximum dimension R, and further preferably not greater than 5 times the maximum dimension R. If the width W1 and the width W2 are each not greater than the foregoing upper limit, the insulating grooves are invisible from outside the solar cell module, so that the appearance and transparency of the solar cell module can be further enhanced. More preferably, the width W1 and the width W2 are each greater than the maximum dimension R of each of the conductive materials 9A, 9B, and 9C, and not less than 1.3 times the maximum dimension R. If the width W1 and the width W2 are each not less than the foregoing lower limit, the insulating grooves can define insulating spaces having excellent insulation performance. In the case where the number of insulating grooves is different between the two base plates, it is preferable that the number of insulating grooves in the photoelectrode-side base plate is less than the number of insulating grooves in the counter electrode-side base plate. In a state in which the solar cell module is installed, an observer tends to view the solar cell module from the photoelectrode side. If the number of insulating grooves on the photoelectrode side is smaller, the observer is unlikely to visually recognize the insulating grooves clearly, which contributes to more favorable appearance of the solar cell module.

The depth of each first insulating groove G1 is not limited, as long as the depth of the deepest part of the groove is not less than the thickness of the photoelectrode conductive layer 21. In other words, the first insulating groove G1 includes a region in which the photoelectrode conductive layer 21 is discontinuous in the submodule arrangement direction (the second direction Y in FIG. 1). Likewise, the depth of the deepest part of each second insulating groove G2 is not less than the thickness of the counter electrode conductive layer 61. In other words, the second insulating groove G2 includes a region in which the counter electrode conductive layer 61 is discontinuous in the submodule arrangement direction (the second direction Y in FIG. 1). More preferably, the photoelectrode conductive layer 21 is discontinuous in the whole first insulating groove G1, and the counter electrode conductive layer 61 is discontinuous in the whole second insulating groove G2.

Some insulating space structures have been described above with reference to FIGS. 3 to 5. As a result of forming insulating spaces by a combination of a plurality of insulating grooves provided on each of the upper and lower substrates as in these structures, insulation between submodules can be ensured without impairing the transparency of the solar cell module. Favorable appearance may be required in applications of the solar cell module. However, given that the light refractive index differs between the part where the photoelectrode conductive layer or the counter electrode conductive layer is present and the part where the photoelectrode conductive layer or the counter electrode conductive layer is not present on the substrate, if the photoelectrode conductive layer or the counter electrode conductive layer is removed in a large area, that is, if the width of the insulating groove is excessively increased, favorable appearance, transparency, etc. of the solar cell module are impaired. By arranging a plurality of insulating grooves on each of the upper and lower substrates as in the present disclosure, insulation between submodules can be ensured without impairing favorable appearance, transparency, etc. of the solar cell module.

(Production Method for Solar Cell Module)

The solar cell module having the above-described structure can be produced, for example, by the following production method, without being limited thereto. The production method is a production method for a solar cell module including: two substrates each including a conductive layer on at least one side; and a plurality of submodules that are interposed between respective conductive layers of the two base plates, are formed by series connecting a plurality of cells arranged in a first direction, and are arranged in a second direction.

Specifically, a production method according to an example preferably includes:

an insulating groove formation step (1) of preparing two substrates each including a conductive layer on at least one side, and forming a plurality of insulating grooves extending in a first direction on a conductive layer-side surface of each of the prepared two substrates, to obtain an insulating groove-equipped first substrate and an insulating groove-equipped second substrate;

an electrode formation step (2) of forming a plurality of first electrodes on a conductive layer-side surface of the insulating groove-equipped first substrate to obtain a first base plate, and forming a plurality of second electrodes on a conductive layer-side surface of the insulating groove-equipped second substrate to obtain a second base plate;

a conductive material arrangement step (3) of providing a conductive material for series connecting adjacent cells in the first direction, on at least one of a conductive layer-side surface of the first base plate and a conductive layer-side surface of the second base plate; and a bonding step (4) of bonding the first base plate including the insulating groove-equipped first substrate (hereafter also simply referred to as "insulating groove-equipped first base plate") and the second base plate including the insulating groove-equipped second substrate (hereafter also simply referred to as "insulating groove-equipped second base plate") obtained as a result of the steps (1) to (3) so that the first electrodes and the second electrodes face each other, to obtain a bonded body.

In the bonding step (4) in this production method, the plurality of insulating grooves of the first base plate and the plurality of insulating grooves of the second base plate are arranged facing each other in the gap between adjacent submodules, as a result of which at least one insulating space that prevents short circuiting between adjacent submodules can be defined. In this production method, the insulating groove formation step (1) is performed before the bonding step (4). Accordingly, for example in the case of producing a dye-sensitized solar cell module as a solar cell module, the insulating groove formation step (1) can be performed before supporting the dye on the photoelectrode. This can eliminate the probability that the dye as an important component contributing to power generation degrades due to heat that can be generated in the insulating groove formation step (1).

The steps (1) to (4) included in the above-described exemplary production method will be described in detail below using an example of producing a dye-sensitized solar cell module having the same structure as the solar cell module 100 described above, with reference to FIGS. 1 to 2.

(1) Insulating Groove Formation Step

In the insulating groove formation step, first, two substrates each including a conductive layer on at least one side are prepared. The substrates and the conductive layers are not limited, and the first substrate, the second substrate, the photoelectrode conductive layer, and the counter electrode conductive layer described in the <First base plate> and <Second base plate> sections may be suitably used. A plurality of insulating grooves whose longitudinal direction is the first direction are then formed on each of the photoelectrode conductive layer-side surface of the first substrate and the counter electrode conductive layer-side surface of the second substrate, to obtain the insulating groove-equipped first substrate and the insulating groove-equipped second substrate. Examples of the insulating groove formation method include, but are not limited to, laser processing and cutting using a blade. As the insulating groove arrangement, the arrangement described in detail in the <Arrangement of insulating grooves> section may be suitably used.

(2) Electrode Formation Step

The electrode formation step may be suitably performed by the method described in the <First base plate> and <Second base plate> sections.

(3) Conductive Material Arrangement Step

The conductive material arrangement step may be suitably performed by the method described in the <Conductive material> section. Specifically, with the provision of the conductive material, the region in which the conductive material is provided can be surrounded by partitions for preventing short circuiting between adjacent cells.

(4) Bonding Step

In the bonding step, the insulating groove-equipped first base plate and the insulating groove-equipped second base plate are bonded together in a state in which the first electrode and the second electrode face each other, to obtain the bonded body. In the bonded body, the plurality of cells arranged in the first direction are electrically connected in series with each other.

The solar cell module according to the present disclosure can be favorably produced by the above-described exemplary production method. Since the production method includes the step (1), a solar cell module having excellent insulation reliability can be produced with high production efficiency.

EXAMPLES

The presently disclosed techniques will be described in detail below by way of examples. The present disclosure is, however, not limited to these examples. In the following description, "%" used to express quantity is by mass, unless otherwise specified.

In each of the examples and reference examples, a dye-sensitized solar cell module was produced by series connecting two submodules arranged in a second direction, each submodule being formed by series connecting six cells in a first direction. The first direction and the second direction were orthogonal to each other.

The dimension and shape of each conductive material used in each of the examples and reference examples were measured as follows. In each of the examples and reference examples, the production efficiency (production yield) of the solar cell module was calculated as follows. In each of the examples and reference examples, the appearance of the obtained solar cell module was evaluated as follows.

<Dimension and Shape of Conductive Material>

100 conductive materials used in each of the examples and reference examples were observed using a scanning electron microscope. The shape of each conductive material was spherical. The major axis length and the minor axis length of each of the 100 conductive materials were measured, and their number-average values were obtained. The number-average major axis length was divided by the number-average minor axis length to calculate the aspect ratio of the conductive materials. Further, the number-average major axis length was taken to be the maximum dimension of the conductive materials.

In all examples and comparative examples the number-average major axis length and the number-average minor axis length of the conductive materials were substantially the same, and the aspect ratio of the conductive materials was 1.0.

<Production Efficiency (Production Yield) of Solar Cell Module>

From the solar cell modules produced in each of the examples and reference examples, 20 solar cell modules misaligned in the bonding step were extracted, and taken to be a population in a production yield test. For the 20 solar cell modules included in the population, the voltage at the lead-out electrode was measured using a source meter under an illuminance condition of 1 sun, and whether there was a voltage drop by one cell or more relative to a theoretical value was determined. In the case where there was no voltage drop or in the case where there was a voltage drop but the voltage drop was less than one cell, it was determined that insulation was ensured in the solar cell module. The ratio (%) of the number of solar cell modules for which insulation was ensured to the total number 20 was calculated.

<Evaluation of Appearance of Solar Cell Module>

20 solar cell modules produced in each of the examples and reference examples were visually observed. The appearance was evaluated for the state of insulating grooves visually observed, based on the following criteria;

A: Insulating grooves were invisible.

B: Insulating grooves were slightly invisible.

Example 1

<Preparation of Dye Solution>

A 200 mL volumetric flask was charged with 72 mg of a ruthenium complex dye (N719 produced by Solaronix). 190 mL of dehydrated ethanol was mixed, and the mixture was stirred. The volumetric flask was stoppered and then subjected to stirring for 60 minutes through vibration by an ultrasonic cleaner. The solution was held at normal temperature, and then dehydrated ethanol was added to adjust the total volume to 200 mL and thereby prepare a dye solution.

<Production of Photoelectrode Base Plate>

A transparent conductive base plate (sheet resistance: 13 ohm/sq.) obtained by coating a transparent base plate (polyethylene naphthalate film of 200 μm in thickness) serving as a photoelectrode substrate with a transparent conductive layer (indium tin oxide (ITO)) serving as a photoelectrode conductive layer was subjected to screen printing to print a conductive silver paste (K3105 produced by Pelnox Limited) at predetermined positions. Heating and drying were then performed for 15 minutes in a 150° C. hot air circulation oven to produce electrical connectors. The transparent conductive base plate including the obtained electrical connectors was set in a coater with its electrical connector formation surface facing upward, and a wire bar was used to apply an ORGATIX PC-600 solution (produced by Matsumoto Fine Chemical Co., Ltd.) that had been diluted to 1.6% at a sweep rate of 10 mm/s. The obtained coating was dried for 10 minutes at room temperature and then further heated and dried for 10 minutes at 150° C. to produce an undercoat layer on the transparent conductive base plate.

Laser processing was performed with respect to the undercoat layer formation surface of the transparent conductive base plate at intervals in accordance with the photoelectrode cell width, to create a region having no photoelectrode conductive layer in the gap between adjacent cells and form insulated wiring. Further, by laser processing, insulating grooves G1 were formed so as to be arranged to satisfy the conditions shown in Table 1 in the submodule gap (insulating groove formation step).

In addition, openings (length: 60 mm; width: 5 mm) for porous semiconductor fine particulate layer formation were formed by punching in a mask film obtained through two-stage stacking of protective films each having a polyester film coated with an adhesive layer (lower stage: PC-542PA produced by Fujimori Kogyo Co., Ltd., upper stage: NBO-0424 produced by Fujimori Kogyo Co., Ltd.). The processed mask film was bonded to the current collector wiring formation surface of the transparent conductive base plate on which the undercoat layer had been formed so that air bubbles would not enter therebetween. The first layer of the mask film was intended to prevent adhesion of dye at unwanted locations, and the second layer of the mask film was intended to prevent adhesion of porous semiconductor fine particles at unwanted locations.

A high-pressure mercury lamp (rated lamp power: 400 W) illuminant was placed at a distance of 10 cm from the mask bonding surface. Immediately after 1 minute of irradiation with electromagnetic waves, a titanium oxide paste (PECC-001-06 produced by Peccell Technologies, Inc.) was applied using a Baker-type applicator. The paste was dried for 10 minutes at normal temperature, and then the upper protective film (NBO-0424 produced by Fujimori Kogyo Co., Ltd.) of the mask film was removed by peeling. Heating and drying were performed for 5 minutes in a 150° C. hot air circulation oven to form porous semiconductor fine particulate layers (length: 60 mm; width: 5 mm).

Thereafter, the transparent conductive base plate on which the porous semiconductor fine particulate layers (length: 60 mm; width: 5 mm) had been formed was immersed in a prepared dye solution (40° C.), and adsorption of the dye was carried out under gentle stirring. After 90 minutes had passed, the titanium oxide films to which the dye had adsorbed were removed from the dye adsorption vessel, washed with ethanol and dried, and then remaining mask film was removed by peeling to produce photoelectrodes.

<Production of Counter Electrode Base Plate>

The conductive surface of a transparent conductive base plate (sheet resistance: 13 ohm/sq.) obtained by coating a transparent base plate (polyethylene naphthalate film of 200 μm in thickness) serving as a counter electrode substrate with a transparent conductive layer (indium tin oxide (ITO)) serving as a counter electrode conductive layer was subjected to laser processing at intervals in accordance with platinum film pattern width to form insulated wiring. Further, by laser processing, insulating grooves G2 were formed so as to be arranged to satisfy the conditions shown in Table 1 in the submodule gap (insulating groove formation step). Next, a metal mask in which openings (length: 60 mm; width: 5 mm) had been formed by punching was overlapped, and sputtering was performed to form six platinum film patterns (catalyst layers) and thereby obtain a counter electrode base plate having light transmittance of approximately 72% in catalyst layer formation parts. The porous semiconductor fine particulate layers and the catalyst layers were made to match when the photoelectrode base plate and the counter electrode base plate were overlapped with their conductive surfaces facing each other.

<Production of Dye-Sensitized Solar Cell Module>

A conductive resin composition was prepared by adding Micropearl AU (typical shape: true spherical, maximum dimension: 20 μm, aspect ratio: 1.0) produced by Sekisui Jushi Corporation to TB3035B as an acrylic resin serving as a resin material of the conductive resin composition so that the amount of Micropearl AU would be 13.5 mass %, and then performing uniform mixing using a planetary centrifugal mixer.

The counter electrode base plate was secured to a suction plate made of aluminum using a vacuum pump with the catalyst layer formation surface of the second base plate as a front surface. Next, a dispensing device was used to apply the conductive resin composition in lines at predetermined positions between the catalyst layers, and to apply a liquid ultraviolet curable sealant TB3035B (produced by Three-Bond Holdings Co., Ltd.; absorption wavelength: 200 nm to 420 nm) as a partition material at the periphery of the catalyst layers such as to sandwich these lines.

Thereafter, a specific amount of electrolyte solution was applied to catalyst layer parts, and an automatic bonding device was used to perform stacking in a reduced pressure environment so as to obtain a structure in which rectangular catalyst layers and similarly shaped porous semiconductor fine particulate layers faced each other. Photoirradiation by a metal halide lamp was performed from the photoelectrode base plate side and then photoirradiation was performed from the counter electrode base plate side (bonding step).

For each obtained solar cell module, the production efficiency was calculated and the appearance was evaluated in the foregoing manner. The results are shown in Table 1.

Example 2 to Reference Example 5

Solar cell modules were produced in the same way as in Example 1, except that the insulating grooves G1 and G2 formed in the insulating groove formation step satisfied the conditions shown in Table 1. The production efficiency was calculated and the appearance was evaluated in the same way as in Example 1. The results are shown in Table 1.

The conditions (1) to (7) in Table 1 are the following:

$$W1 > R \text{ and } W2 > R \quad (1)$$

$$(W1+D1) > (W2+D2) \quad (2)$$

$$(W1-D2) \leq 2R \quad (3)$$

$$(W1+D1)/(W2+D2) \neq Z \text{ or } (Z+0.5) \quad (4)$$

(where Z is an integer)

$$N1 \geq (A+1) \text{ and } N2 \geq (B+1) \quad (5)$$

(where A and B are each independently a minimum natural number satisfying the following relationship ($\alpha$):

$$A \times (W1+D1) = B \times (W2+D2) \quad (\alpha)$$

$$(W1+D1) \geq (W2+D2) \quad (6)$$

$$(W1-D2) > 2R. \quad (7)$$

Of the conditions (1) to (7), any of the following two condition sets is preferably satisfied. In the case where at least one of the following two condition sets is satisfied, insulation can be ensured with high probability even in the case where misalignment occurs during bonding in the production process. A solar cell module satisfying Set1 or Set2 has high production yield for products with favorable insulation and excellent production efficiency.

Condition set 1 (Set1): (1) to (5)
Condition set 2 (Set2): (1), (6), and (7).

As is clear from Examples 1 to 4 and Reference Examples 1 to 5 in Table 1, a solar cell module including a new inter-submodule insulation structure was able to be provided according to the present disclosure. Moreover, as is clear from Table 1, a solar cell module capable of ensuring insulation was efficiently produced even in the case where misalignment occurred during bonding in the production process.

INDUSTRIAL APPLICABILITY

It is thus possible to provide a solar cell module having a new inter-submodule insulation structure.

REFERENCE SIGNS LIST

1 first substrate
2 photoelectrode
3 first base plate
4 electrolyte layer
5 second substrate
6 counter electrode
7 second base plate
8 partition
9, 9A to 9D conductive material
12A first electrical connector
12B second electrical connector
21, 21A to 21B photoelectrode conductive layer
22 porous semiconductor fine particulate layer
61, 61A to 61B counter electrode conductive layer
62 catalyst layer
100 solar cell module

|  |  |  |  |  | Example | | | | Reference Example | | | | |
|---|---|---|---|---|---|---|---|---|---|---|---|---|---|
|  |  |  |  |  | 1 | 2 | 3 | 4 | 1 | 2 | 3 | 4 | 5 |
| Conductive material | | Typical shape | | | Spherical | Spherical | Spherical | Spherical | Spherical | Spherical | Spherical | Spherical | Spherical |
|  |  | Maximum dimension | R | (μm) | 20 | 20 | 20 | 20 | 20 | 20 | 20 | 20 | 20 |
|  |  | Aspect ratio | | | 1.0 | 1.0 | 1.0 | 1.0 | 1.0 | 1.0 | 1.0 | 1.0 | 1.0 |
| Insulating groove formation conditions | Insulating grooves G1 | Width | W1 | (μm) | 30 | 30 | 180 | 180 | 30 | 30 | 30 | 30 | 30 |
|  |  | Distance | D1 | (μm) | 20 | 100 | 10 | 190 | 10 | 10 | 10 | 30 | 50 |
|  |  | W1 + D1 | | (μm) | 50 | 130 | 190 | 370 | 40 | 40 | 40 | 60 | 80 |
|  |  | Number | N1 | (grooves) | 5 | 5 | 2 | 37 | 2 | 6 | 14 | 3 | 2 |
|  | Insulating grooves G2 | Width | W2 | (μm) | 30 | 30 | 180 | 180 | 30 | 30 | 30 | 30 | 30 |
|  |  | Distance | D2 | (μm) | 10 | 10 | 10 | 180 | 10 | 10 | 10 | 10 | 10 |
|  |  | W2 + D2 | | (μm) | 40 | 40 | 190 | 360 | 40 | 40 | 40 | 40 | 40 |
|  |  | Number | N2 | (grooves) | 6 | 14 | 2 | 38 | 2 | 6 | 14 | 4 | 3 |
| Condition parameters | | W1 − D2 | | (μm) | 20 | 20 | 170 | 0 | 20 | 20 | 20 | 20 | 20 |
|  |  | 2R | | (μm) | 40 | 40 | 40 | 40 | 40 | 40 | 40 | 40 | 40 |
|  |  | (W1 + D1)/(W2 + D2) | | | 1.25 | 3.25 | 1.00 | 1.03 | 1.00 | 1.00 | 1.00 | 1.50 | 2.00 |
| Condition satisfaction | (1) | | | | Set1 | Set2 | OK | OK | OK | OK | OK | OK | OK | OK |
|  | (2) | | | | — | OK | OK | — | OK | — | — | — | OK | OK |
|  | (3) | | | | — | OK | OK | — | OK | OK | OK | OK | OK | OK |
|  | (4) | | | | — | OK | OK | — | OK | — | — | — | — | — |
|  | (5) | | | | — | OK | OK | — | OK | OK | OK | OK | OK | OK |
|  | (6) | | | | — | — | Set2 | — | — | OK | — | OK | OK | OK | OK | OK |
|  | (7) | | | | — | — | — | — | OK | — | — | — | — | — |
| Evaluation | | Yield | | (%) | 60 | 90 | 95 | 95 | 5 | 5 | 5 | 5 | 5 |
|  |  | Appearance | | | A | A | B | B | A | A | A | A | A |

101A to 101B submodule
120A to 120E insulating space
200 external device
D1, D2 distance
G1, G2 insulating groove
P conduction path
R maximum dimension
W1, W2 width
X first direction
Y second direction

The invention claimed is:

1. A solar cell module comprising:
two base plates each including a conductive layer on at least one side; and
a plurality of submodules interposed between respective conductive layers of the two base plates, wherein
the plurality of submodules each include a plurality of cells connected to each other as a result of a conductive material electrically connecting the respective conductive layers of the two base plates,
the plurality of cells are arranged in a first direction,
the plurality of submodules are arranged in a second direction orthogonal to the first direction,
the two base plates each have a plurality of insulating grooves, each defining a recess, extending in the first direction in a gap between the plurality of submodules,
the plurality of insulating grooves of one of the two base plates and the plurality of insulating grooves of an other one of the two base plates define at least one insulating space extending in the first direction that prevents short circuiting between adjacent submodules,
the conductive material has a spherical shape and a maximum dimension of 0.5 µm or more and 30 µm or less, and
the at least one insulating space is capable of containing the conductive material that is not in contact with at least one of the conductive layers so as to create a state in which the conductive material is not in contact with at least one of the conductive layers.

2. The solar cell module according to claim 1, satisfying the following relationships (1) to (5):

$$W1 > R \text{ and } W2 > R \quad (1)$$

$$(W1+D1) > (W2+D2) \quad (2)$$

$$(W1-D2) \leq 2R \quad (3)$$

$$(W1+D1)/(W2+D2) \neq Z \text{ or } (Z+0.5) \quad (4)$$

$$N1 \geq (A+1) \text{ and } N2 \geq (B+1) \quad (5)$$

where the plurality of insulating grooves of the one of the two base plates are denoted as insulating grooves G1, the plurality of insulating grooves of the other one of the two base plates are denoted as insulating grooves G2, W1 is a width of each of the insulating grooves G1 in µm, D1 is a distance between the insulating grooves G1 in µm, N1 is the number of the insulating grooves G1, W2 is a width of each of the insulating grooves G2 in µm, D2 is a distance between the insulating grooves G2 in µm, N2 is the number of the insulating grooves G2, R is a maximum dimension of the conductive material in µm, Z is an integer between 1 and 3, and A and B are each independently a minimum natural number satisfying the following relationship (a):

$$A \times (W1+D1) = B \times (W2+D2) \quad (\alpha).$$

3. The solar cell module according to claim 1, satisfying the following relationships (1), (6), and (7):

$$W1 > R \text{ and } W2 > R \quad (1)$$

$$(W1+(W2+D2) \quad (6)$$

$$(W1-D2) > 2R \quad (7)$$

where the plurality of insulating grooves of the one of the two base plates are denoted as insulating grooves G1, the plurality of insulating grooves of the other one of the two base plates are denoted as insulating grooves G2, W1 is a width of each of the insulating grooves G1 in µm, D1 is a distance between the insulating grooves G1 in µm, W2 is a width of each of the insulating grooves G2 in µm, D2 is a distance between the insulating grooves G2 in µm, and R is a maximum dimension of the conductive material in µm.

* * * * *